United States Patent
Kondou et al.

(10) Patent No.: US 7,526,716 B2
(45) Date of Patent: Apr. 28, 2009

(54) RECORDING/REGENERATING DEVICE, METHOD OF ENCODING ERROR CORRECTION, METHOD OF RECORDING DATA

(75) Inventors: Masaharu Kondou, Kanagawa (JP); Hideki Sawaguchi, Tokyo (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 608 days.

(21) Appl. No.: 11/094,019

(22) Filed: Mar. 30, 2005

(65) Prior Publication Data
US 2005/0216818 A1 Sep. 29, 2005

(30) Foreign Application Priority Data
Mar. 29, 2004 (JP) ............................. 2004-096512

(51) Int. Cl.
*H03M 13/03* (2006.01)
(52) U.S. Cl. ...................................... 714/785; 714/784
(58) Field of Classification Search ................. 714/781, 714/784, 785
See application file for complete search history.

(56) References Cited

U.S. PATENT DOCUMENTS 6,631,172 B1 * 10/2003 Shokrollahi et al. ......... 375/340
6,990,624 B2 * 1/2006 Dohmen et al. ............. 714/785
2005/0257115 A1 * 11/2005 Piret et al. .................. 714/752

FOREIGN PATENT DOCUMENTS

JP 2002-118471 4/2002

OTHER PUBLICATIONS

Hansen et al., "Determination of Error Values for Algebraic-Geometry Codes and the Forney Formula," *IEEE Transaction on Information Theory*, vol. 44, No. 5, pp. 1881-1886, Sep. 1998.
Miura, "Algebraic Geometric Codes on a Plane Curve," *Electronics and Communications in Japan*, Part 3, vol. 76, No. 12, 1993 (Translated from *the Institute of Electronics, Information and Communication Engineers Transaction (A)*, vol. J75-A, No. 11, pp. 1735-1745, Nov. 1992).
Sakata, "A Vector Version of the BMS Algorithm for Implementing Fast Erasure-and-Error Decoding of One-Point AG codes," *Proc. AAECC-12*, Springer Verlag, pp. 291-310, 1997.

(Continued)

*Primary Examiner*—Esaw Abraham
(74) *Attorney, Agent, or Firm*—Townsend and Townsend and Crew LLP; Patrick Duncan

(57) ABSTRACT

Embodiment of the invention is to make the number of interleave sequences and the number of redundant bits as small as possible without increasing the number of bits per symbol so much. By encoding data into an error-correcting code by using an algebraic geometric code consisting of an algebraic curve surface having a genus g over a projective plane $P^{c-1}$ ($GF(2^m)$), where m is a positive integer, the code up to a length of $2^m + 2^{1+m/2}$ g is constructed. In particular, by using a "Fermat code," a version of the algebraic geometric code, consisting of a Fermat curve "$C_{(L)}$: $X^L + Y^L + Z^L = 0$" over the $P^2(GF(2^{2m}))$, where (m, L)=(5, 11), 4-Kbyte data constituting one sector can be encoded into the code made up of 10-bit symbols.

19 Claims, 7 Drawing Sheets

OTHER PUBLICATIONS

Sakata, "Algebraic Geometric Codes and Decoding Method Thereof," *Mathematical Sciences*, No. 421, pp. 33-40, Jul. 1998.

Sakata, "Algebraic Geometric Codes and Decoding Method Thereof," *Mathematical Sciences*, No. 422, pp. 58-65, Aug. 1998.

Shibuya et al., "On the Performance of Algebraic Geometric Codes," *IEICE Transaction on Fundamentals*, vol. E79-A, No. 6, pp. 298-937, Jun. 1996.

* cited by examiner interleaved sequences   check symbols
of a sector             of RS code

RECORDING/REGENERATING DEVICE, METHOD OF ENCODING ERROR CORRECTION, METHOD OF RECORDING DATA

CROSS-REFERENCES TO RELATED APPLICATIONS

This application claims priority from Japanese Patent Application No. JP 2004-096512, filed Mar. 29, 2004, the entire disclosure of which is incorporated herein by reference.

BACKGROUND OF THE INVENTION

The present invention relates to information recording/reproducing devices and, more particularly, to an information recording/reproducing device employing a new error correction coding method.

For information recording/reproducing devices such as magnetic disk devices, magneto-optical disk device, and compact disk devices, Reed-Solomon codes are used. This code consists of $2^8$ elements in magnetic disk devices. A Reed-Solomon code over a Galois field $GF(2^8)$ that is a set of elements for pairs, of which addition, subtraction, multiplication, and division are defined, but "divide by 0" is not defined in division, is used. This Reed-Solomon coding, in which each symbol consists of eight bits (one byte) as a unit of computing, makes error correction of signals that are recorded and reproduced.

The Reed-Solomon codes that are capable of correcting up to t symbols are constructed by including 2t redundant (parity) symbols. The length of sectors that are units of data to be recorded and reproduced at a time is 512 symbols (512 bytes). However, because the length of the Reed-Solomon codes that can be constructed over the $GF(2^8)$ is not greater than $2^8-1=255$ symbols, data is separated (interleaved) into three or more blocks and each block is constructed by the RS error correction coding. FIG. 10 shows the order of symbols including Reed-Solomon parity bytes recorded in a sector and associated RS code structures.

An advantage of the Reed-Solomon codes is that, in polynomial expression of codewords, the positions of the symbols can be arranged from the highest order $\alpha^{n-1}, \alpha^{n-2}, \ldots \alpha^2, \alpha^1, \alpha^0$ ($\alpha$: a primitive root of Galois field) and the positions of the symbols can be calculated orderly only by a multiplier during Chien search when the codewords are decoded. The Chien search is a method of evaluating an equation by assigning elements to it in order.

With a recent trend of using magnetic disk devices in video application, the International Disk Drive Equipment Material Association (IDEMA) and other organizations are discussing the usage of sectors longer than 512 bytes in a magnetic disk device, while maintaining conventional read/write processing in units of 512 bytes on the interface to the host side. One suggestion is a Reed-Solomon code organization with eight interleaving sequences that can preferably be used as an error-correcting code for data separated by a sector length of 4 Kbytes=32768 bits.

Relevant references include the following:

Non-patent Document 1: Shinji Miura, "Algebraic Geometric Codes on a Plane Curve," the Institute of Electronics, Information and Communication Engineers Transaction (A), Vol. J75-A, No. 11, pp. 1735-1745, 1998;

Non-patent Document 2: T. Shibuya, H. Jinushi and S. Miura, "On the Performance of Algebraic Geometric Codes," IEICE Transaction on Fundamentals, Vol. E79-A, No. 6, pp. 291-310, June 1996;

Non-patent Document 3: Shojiro Sakata "Algebraic Geometric Codes and Decoding Method Thereof," Mathematical Sciences, No. 421, pp. 33-40, No. 422, pp. 58-60, 1998;

Non-patent Document 4: S. Sakata, "A Vector Version of the BMS Algorithm for Implementing Fast Erasure-and-Error Decoding of One-Point AG codes," Proc. AAECC-12, Springer Verlag, pp. 291-310, 1997;

Non-patent Document 5: J. P. Hansen, H. E. Jensen, and R. Koetter, "Determination of Error Values for Algebraic-Geometry Codes and the Forney Formula," IEEE Transaction on Information Theory, Vol. 44, No. 5, pp. 1881-1886, September 1998; and Patent Document 1: JP-A No. 118471/2002.

SUMMARY OF THE INVENTION

Since the ratio of errors in a sector is proportional to "the probability of interleaved codeword bytes (symbols) becoming biased and uncorrectable" and "the number of interleaving sequences," that ratio can be lowered when interleaving is not performed from the ratio when interleaving is performed. However, due to the Reed-Solomon code length restriction, for error correction coding of data with a length of $a_0$ bits without the use of interleaving, it is necessary to construct an RS code with symbols, each consisting of bits corresponding to an integer m that satisfies $a_0/m \leq 2^m-1$. For example, if data with a length of 4 Kbytes (32768 bits) is RS coded without interleaving, it is conditioned that the number of bits per symbol m is equal to or greater than 12 bits. In fact, the number of redundant bits not only increases in proportion to the number of correctable errors, but also increases in proportion to the number of bits per symbol m. This means that the number of redundant bits increases by a factor of 8 or more if the sector length increases by a factor of 8 and the number of correctable errors increases by a factor of 8. This also means that, as the number of bits per symbol m increases, the number of bits needed to correct one error (2m) increases, and, in other words, the efficiency of error correction of redundant bits decreases.

Even if interleaving is inevitable when decoding delay and other conditions are taken into account, it is desirable not to increase the number of bits per symbol m so much and to make the number of interleaving sequences and the number of redundant bits as small as possible.

By using algebraic geometric codes (AG codes) over the $GF(2^m)$, codes that are longer than $2^m-1$ are constructed. In this code structure, extra redundant symbols are added, but the number of redundant bits is reduced by decreasing the number of bits per symbol instead.

An algebraic geometric code consists of an algebraic curve surface "C: $f(X_1:X_2: \ldots :X_c)=0$" over a projective plane $P^{c-1}(GF(2^m))$ (how to construct this code will be described later). The components of the projective plane $P^{c-1}(GF(2^m))$ are the ratios of coordinates $(GF(2^m))^c/\{(0, 0, \ldots, 0)\}$. On this projective plane, $(\alpha_1, \alpha_2, \ldots, \alpha_c)$ and $(\chi\alpha_1, \chi\alpha_2, \ldots, \chi\alpha_c)$ (where $\chi \neq 0$) are regarded as same points and represented as $(\alpha_1 : \alpha_2 : \ldots : \alpha_c)$ particularly in consideration of the ratios of the coordinates. The algebraic geometric codes are a general form of the Reed-Solomon codes and, in other words, the Reed-Solomon codes are a particular version of the algebraic geometric codes. FIG. 11 is a diagram showing relationship among the Reed-Solomon codes, algebraic geometric codes, elliptic codes, and Fermat codes, the latter two of which will be described later.

For the algebraic curve surface, a parameter called genus g is defined. The genus is a generalized quantity representing the number of holes of a closed surface in a three-dimensional space. It is known that the genus of a curve remains unchanged after the curve is transformed by (is invariant to) birational mapping and that $g=(a-1)(b-1)/2$ for a $C_a^b$ curve on a projective plane $P^2(GF(2^m))$ (refer to the non-patent documents 1 and 2 above).

Suppose that $E(C, GF(2^m))$ represents the following set where $\epsilon$ is the number of elements in $E(C, GF(2^m))$. A point included in $E(C, GF(2^m))$ is called a $GF(2^m)$ rational point of C. If the $GF(2^m)$ field is evident from the context, the point is simply called a rational point of C.

$$E(C, GF(2^m)) := \{(\alpha_1 : \alpha_2 : \ldots : \alpha_c) \in P^{c-1}(GF(2^m)) | f(\alpha_1 : \alpha_2 : \ldots : \alpha_c) = 0\}$$

Equation 1

In $E(C, GF(2^m))$, one point Q is fixed and points that belong to $E(C, GF(2^m))/\{Q\}$ are numbered as $P^{(1)}, P^{(2)}, \ldots, P^{(\epsilon-1)}$. By setting the dimension of a function space $L(r_0 Q)$ over C to be r, an AG codeword consisting of C is defined as a column vector w that satisfies $Hw=0$ for a matrix H that is expressed in equation 2. Here, the bases of $L(r_0 Q)$ are represented as $\{v_0(P), v_1(P), v_2(P), \ldots, v_{r-1}(P)\}$.

$$H = (h_{i,j})_{\substack{1 \leq i \leq r \\ 1 \leq j \leq n}}, \quad h_{i,j} = v_{i-1}(P^{(j)})$$

Equation 2

More specifically, code length n up to $\epsilon-1$ can be given, in which $\epsilon$ satisfies equation 3.

$$\epsilon \leq 2^{2m} + 1 + 2^{m+1} g$$

Equation 3

When there is a square matrix M which satisfies equation 4 as a condition of the check matrix H, the AG codeword can be constructed as a systematic code.

$$MH = [H_1 | I_r]$$

Equation 4

The following are known. In the case of the $C_a^b$ curve and $Q=(0:1:0)$ over the projective plane $P^2(GF(2^m))$, $r_0=r+1-g$ is satisfied when $r>2g$; random errors up to $(r-g)/2$ in number are correctable when $r>3g-1$; and a set that is expressed in equation 5 is assigned to the bases of $L(r_0 Q)$.

$$\{x(P)^i y(P)^j | ai + bj \leq r-1+g, 0 \leq i, 0 \leq j < a\}, \text{ where } x(X:Y:Z) = X/Z, y(X:Y:Z) = Y/Z$$

Equation 5

Hence, when $2t+g>3g-1$, a codeword in which up to t symbols are correctable can be constructed by including $2t+g$ redundant symbols.

Normally, the bases of equation 2 are numbered in ascending order of $ai+bj$.

In the following, the use of a Fermat code that is an AG code consisting of a Fermat curve "$C_{(L)}: X^L + Y^L + Z^L = 0$" over the projective plane $P^2(GF(2^{2m}))$ will be discussed. Given $\phi(X:Y:Z) := (X:Y:Y+Z)$, $\phi(C_{(L)})$ is a $C_{L-1}{}^L$ curve (a $C_a^b$ curve where $(a, b) = (L-1, L)$) and, therefore, $g=(L-1)(L-2)/2$.

By assigning $C=\phi(C_{(L)})$ and $Q=(0:1:0)$, equations 2 and 3 are satisfied. When L is a divisor of $2^m+1$ that is greater than 1, it is presumed that equation 3 always has equality. The bases of equation 2 are specifically ordered as in equation 6.

$$\begin{cases} v_0(X:Y:Z) = 1 \\ v_1(X:Y:Z) = \dfrac{X}{Y+Z}, v_2(X:Y:Z) = \dfrac{Y}{Y+Z} \\ v_{\frac{1}{2}s(s+1)+\lambda}(X:Y:Z) = \left(\dfrac{X}{Y+Z}\right)^\lambda \left(\dfrac{Y}{Y+Z}\right)^{s-\lambda} \quad (2 \leq s \leq l-2, 0 \leq \lambda \leq s) \\ v_\lambda(X:Y:Z) = \dfrac{X}{Y+Z}, \times v_{\lambda-(l-1)}(X:Y:Z) \quad \left(\dfrac{1}{2}(l-1)l \leq \lambda \leq r-1\right) \end{cases}$$

Equation 6

Here, $\{v_0(\phi(P)), v_1(\phi(P)), v_2(\phi(P)), \ldots, v_{r-1}(\phi(P))\}$ are the bases of a function space $L(r_0 \phi^{-1}(Q))$ over $C_{(L)}$.

Matrix H defined by equation 2 when $C=\phi(C_{(L)})$ and $Q=(0:1:0)$ agrees with matrix H defined by equation 2 when $C=C_{(L)}$ and $Q=\phi^{-1}(0:1:0)$. This is generally true when the components $\phi_X, \phi_Y$, and $\phi_Z$ of $\phi(X:Y:Z) = (\phi_X : \phi_Y : \phi_Z)$ are represented by rational mapping of X, Y, and Z and the components of $\phi^{-1}(X:Y:Z)$ are also represented by rational mapping of X, Y, and Z (that is, $\phi(X:Y:Z)$ is birational mapping).

Data of 4 Kbytes, that is, $4 \times 1024 \times 8$ bits is equivalent to 3277 10-bit symbols. The maximum length of a Fermat code with set values of $(m, L)=(5, 11)$ is 3904 symbols and $g=45$. Thus, the number of redundant symbols is $3904-3277=627$. The maximum number of correction symbols is therefore 291 ($291 \times 2+45=627$). By using this code, it will be possible to construct a 4-Kbyte sector with 10-bit symbols without interleaving.

In particular, when equation 7 is satisfied, equations 8 and 9 are satisfied and points can be calculated by using the elements in subsets (subfields) and n-th power roots thereof.

$$\begin{cases} 2m = 2^u(2e+1) \text{ where } u \geq 1, e \geq 1 \\ l = (2^m+1)/(2^{2^{u-1}}+1) \end{cases}$$

Equation 7

$$E(C_{(l)}, GF(2^{2^u(2s+1)})) =$$

Equation 8

$$\bigcup_{P \in \mathcal{P}} \{\tau_{(j_X, j_Y, 0)}(P) \mid j_X, j_Y \in Z/lZ\}$$

$$\bigcup \{\tau_{(j_X, 0, 0)}(1:0:1) \mid j_X \in Z/lZ\}$$

$$\bigcup \{\tau_{(j_X, 0, 0)}(1:1:0) \mid j_X \in Z/lZ\}$$

$$\bigcup \{\tau_{(0, j_Y, 0)}(0:1:1) \mid j_Y \in Z/lZ\}$$

$$\begin{cases} \tau_{(j_X, j_Y, j_Z)}((\xi_X : \xi_Y : \xi_Z)) := ((\alpha^s)^{j_X} \xi_X : (\alpha^s)^{j_Y} \xi_Y : (\alpha^s)^{j_Z} \xi_Z) \\ \mathcal{P} = \{(\xi^{u_0} : (\xi+1)^{u_0} : 1) \mid \xi \in GF(2^m) \setminus GF(2)\} \\ \bigcup \{(\xi^{u_1/u_2} : (\xi+1)^{u_1/u_2} : 1) \mid \xi \in GF(2^{2u}) \setminus GF(2^{2u-1})\}, \\ u_0 = 2^{2u-1}+1, u_2 = \gcd(l, 2^{2u}-1), u_1 l \equiv u_2 \pmod{2^{2u}-1} \end{cases}$$

Equation 9

By using the AG codes, the number of bits per symbol in an error-correcting code can be made smaller than when the Reed-Solomon codes are used. As a result, the number of redundant bits can be reduced accordingly. This is because of the following reason. Adding two redundant symbols is always required to enhance a code capable of correcting up to t symbols to the code capable of correcting up to t+1 symbols. The smaller the number of bits per symbol in the error-correcting code, the lower the number of redundant bits to be added is required.

In the following, the number of redundant bits included in a Reed-Solomon code that can be constructed with 4 Kbytes of one sector and parity bytes for a magnetic disk device will be compared with the number of redundant bits included in the above-described Fermat code example.

For the Reed-Solomon code, due to its code length restriction, the code entity that is equal to or greater than a $GF(2^{12})$ must be used. In the case of the code over the $GF(2^{12})$, it is essential to add 2t 12-bit redundant symbols. Thus, the total number of redundant bits is 2t symbols multiplied by 12 bits, that is, 24t bits.

On the other hand, for the corresponding data size, the Fermat code that comprises $C_{(11)}: X^{11} + Y^{11} + Z^{11} = 0$ ($g=(11-1)(11-2)/2=45$) can be used. In this case, it is essential to add 10-bit redundant symbols that are $2t+g=2t+45$ in number. Thus, the total number of redundant bits is $(2t+45)$ symbols multiplied by 10 bits, that is, $20t+450$ bits. By comparison, it turns out that the $20t+450$ redundant bits of the Fermat code are less than the 24t redundant bits of the Reed-Solomon code when $t \geq 113$.

By comparison on the condition that error correction coding is performed to allow for correcting random errors in, for example, up to 240 symbols, 5760 redundant bits are included in the Reed-Solomon code and 5250 redundant bits are included in the Fermat code. The number of redundant bits in the Fermat code can be reduced by 510 bits less than that in the Reed-Solomon code.

If the number of redundant bits is fixed to, for example, 5760 (so the Reed-Solomon code over the GF($2^{12}$) can correct random errors in up to 240 symbols), the Fermat code over the GF($2^{10}$) can correct random errors in up to 265 symbols, because 20×265+450<5760<20×266+450. Hence, in this case, by calculation, the number of random errors that are permissible in one sector can be increased by 10% or more.

The present invention aims to improve the efficiency of error correction with redundant bits and the invention reduces the number of bits per symbol for symbols constituting an error-correcting code and, consequently, can achieve a reduced number of redundant bits in the code less than those bits in conventional Reed-Solomon codes.

DETAILED DESCRIPTION OF THE INVENTION

An embodiment of the present invention will be described hereinafter with reference to the accompanying drawings. In the following drawings, similar functional parts are assigned the same reference numbers for easily understandable explanation.

Figure 2:
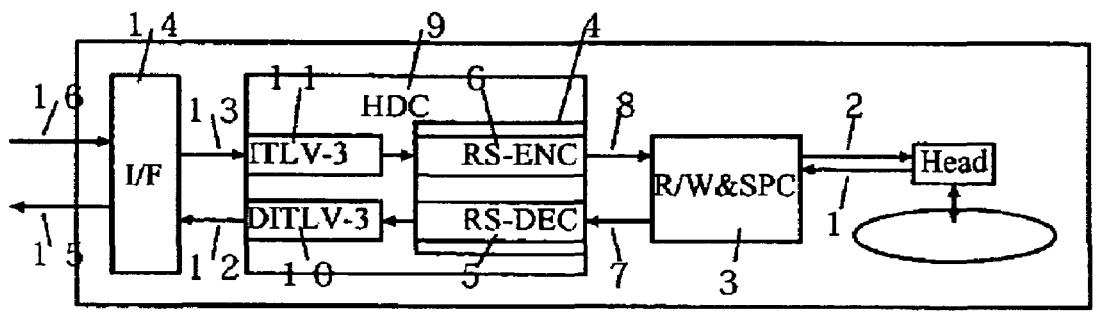
FIG. 2 is a schematic of a conventional magnetic disk device.

FIG. 2 is a schematic of a conventional magnetic disk device. Input signals per sector 16 are converted into binary data per sector by an interface (I/F) 14. The binary data per sector 13 is input as is, as a data block, to a hard disk controller (HDC) 9. The binary data per sector 13 input to the hard disk controller 9 is separated into three data blocks by an interleaver (ITLV-3) 11 and each data block is encoded into an error-correcting code by a Reed-Solomon encoder circuit (RS-ENC) 6. The error-correcting code corresponding to each data block 8 is converted into analog signals 2 to be recorded on a medium by a signal processing LSI (R/W & SPC) 3 and the analog signals are sent to a head. The signals are recorded on a magnetic disk, the recording medium.

On the other hand, signals 1 read by the head undergo signal processing such as equalization and Viterbi decoding by the signal processing LSI 3. After discrimination between 0s and 1s, the signals are converted into binary data. The converted binary data 7 enters the hard disk controller 9 and errors in the binary data are detected and corrected by a Reed-Solomon decoder circuit (RS-DEC) 5 in the controller. Three codeword blocks decoded by the decoder circuit 5 are combined into a codeword block by a deinterleaver (DITLV-3) 10. The decoded binary data is converted into signals 15 to be output by the I/F 14.

Although a Reed-Solomon encoding/decoding LSI into which the RS-DEC 5 and the RS-ENC 6 are integrated on one chip is adopted in this example, these circuits may be provided as separate entities without being integrated on the one chip.

Figure 1:
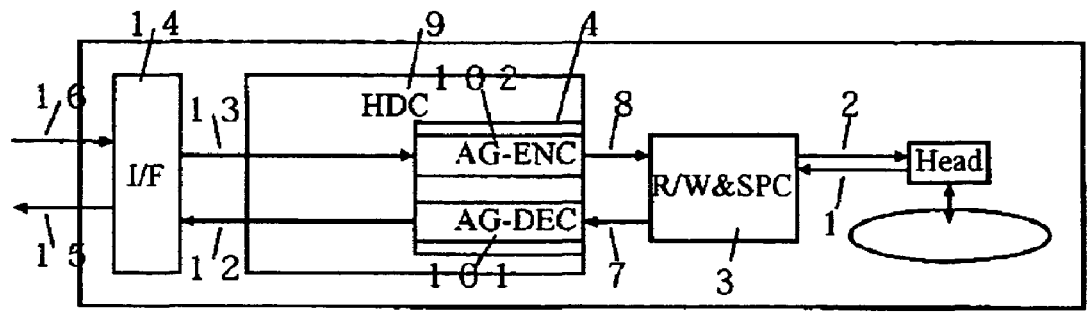
FIG. 1 is a schematic showing an example of a magnetic disk device according to an embodiment of the present invention.

FIG. 1 is a schematic showing an example of a magnetic disk device according to an embodiment of the present invention. The input signals per sector 16 consisting of 4 Kbytes (corresponding to 3277 10-bit symbols) are analog-to-digital converted into binary data per sector by the interface (I/F) 14 which is a means for analog-to-digital conversion (A/D conversion). The binary data per sector is encoded as is, as a data block, into an error-correcting code by a Fermat encoder circuit 102 which is an encoding means. The error-correcting code of the data block 8 is converted into analog signals 2 to be recorded on a medium by the signal processing LSI (R/W & SPC) 3 and the analog signals are sent to the head. The signals are recorded on a magnetic disk, the recording medium.

On the other hand, the signals 1 read by the head undergo signal processing such as equalization and Viterbi decoding by the signal processing LSI 3. After discrimination between 0s and 1s, the signals are converted into binary data. The converted binary data 7 enters the hard disk controller 9 and errors in the binary data encoded in the error-correcting code are detected and corrected by a Fermat decoder circuit 101 in the controller. The decoded binary data is converted into signals 15 to be output by the I/F 14.

Figure 3:
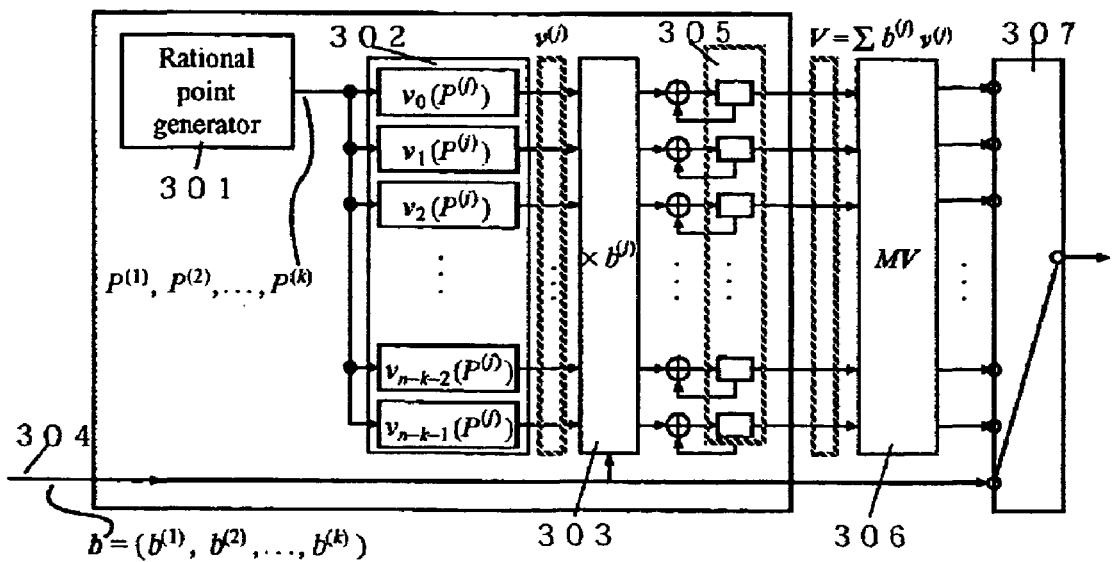
FIG. 3 is a schematic diagram of a Fermat encoder circuit.

FIG. 3 is a schematic diagram of the Fermat encoder circuit (AG-ENC) 102. This encoder configuration is an improved and extended version of an elliptic encoder described in the patent document 1.

A sequence of input symbols $b^{(1)}, b^{(2)}, \ldots, b^{(k)}$ (k=3277 in this example) is input through an input terminal 304. A rational point generator 301 outputs a point $P^{(j)}$ at timing when $b^{(j)}$ is input. When receiving the input of the point, a vector generator circuit 302 outputs a vector $v^{(j)}$. When receiving the inputs of the vector $v^{(j)}$ and the symbol $b^{(j)}$, a scalar multiplier 303 outputs $b^{(j)}v^{(j)}$ which is in turn added to and stored into a memory 305 for storing syndrome data and, at the same time, the $b^{(j)}$ passes through a selector 307. After completing processing on the k symbols, a matrix arithmetic circuit 306 receives the inputs of addition results and outputs vectors MV. The selector 307 selects and outputs the contents of the vectors MV in order from the top.

To the inputs $P^{(j)}=(\alpha_j, \beta_j, 1)$, the vector generator circuit 302 outputs $[v_0(P^{(j)}), v_1(P^{(j)}), v_2(P^{(j)}), \ldots, v_{n-k-1}(P^{(j)})]$ which are obtained by equation 10, based on (m, L)=(5, 11) and derived from equation 6.

$$\begin{cases} v_0(P^{(j)}) = 1 \\ v_1(P^{(j)}) = \dfrac{\alpha_j}{\beta_j + \gamma_j}, \; v_2(P^{(j)}) = \dfrac{\beta_j}{\beta_j + \gamma_j} \\ v_{\frac{1}{2}s(s+1)+\lambda}(P^{(j)}) = \left(\dfrac{\alpha_j}{\beta_j + \gamma_j}\right)^\lambda \left(\dfrac{\beta_j}{\beta_j + \gamma_j}\right)^{s-\lambda} & (2 \le s \le 9, 0 \le \lambda \le s) \\ v_\lambda(P^{(j)}) = \dfrac{\alpha_j}{\beta_j + \gamma_j} \times v^{(j)}_{j-10}(P^{(j)}) & (55 \le \lambda \le r-1) \end{cases} \quad \text{Equation 10}$$

According to equation 2, a j-th column in a check matrix H from the outputs of the vector generator circuit 302 is located. The matrix arithmetic circuit 306 generates an (n−k)-order square matrix where M satisfies equation 4 when r=n−k.

In the following, the points corresponding to the symbols in the 1st, 2nd, ..., 3904th positions relative to the reference position for counting the symbols will be denoted as $P^{(1)}$, $P^{(2)}$, ..., $P^{(3904)}$.

Figure 4:
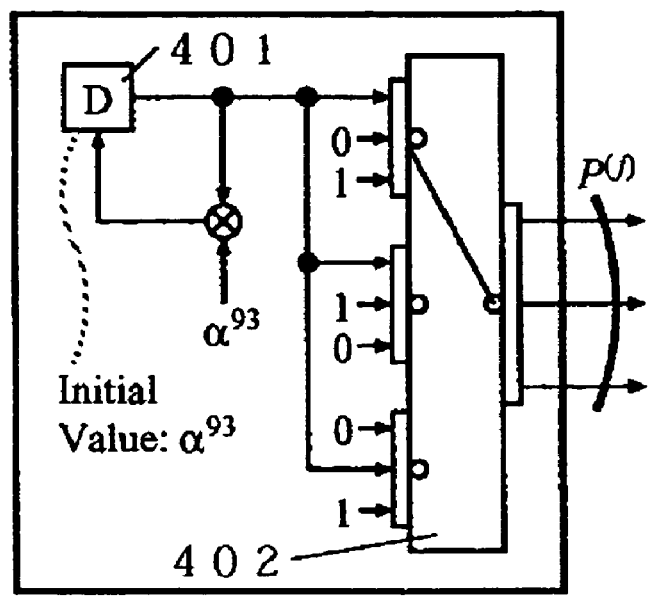
FIG. 4 is a schematic diagram showing a configuration example of a circuit to generate rational points falling in Group A.
Figure 5:
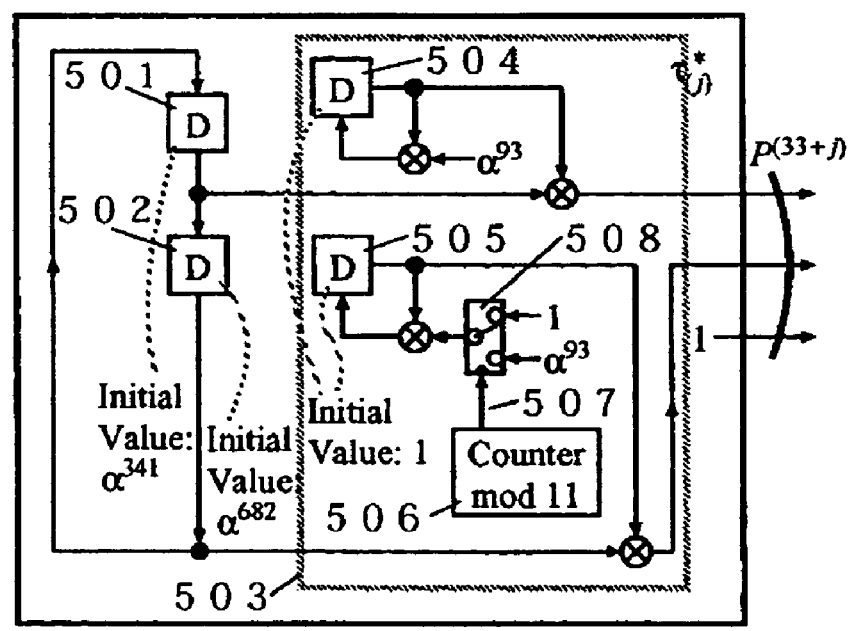
FIG. 5 is a schematic diagram showing a configuration example of a circuit to generate rational points falling in Group B.
Figure 6:
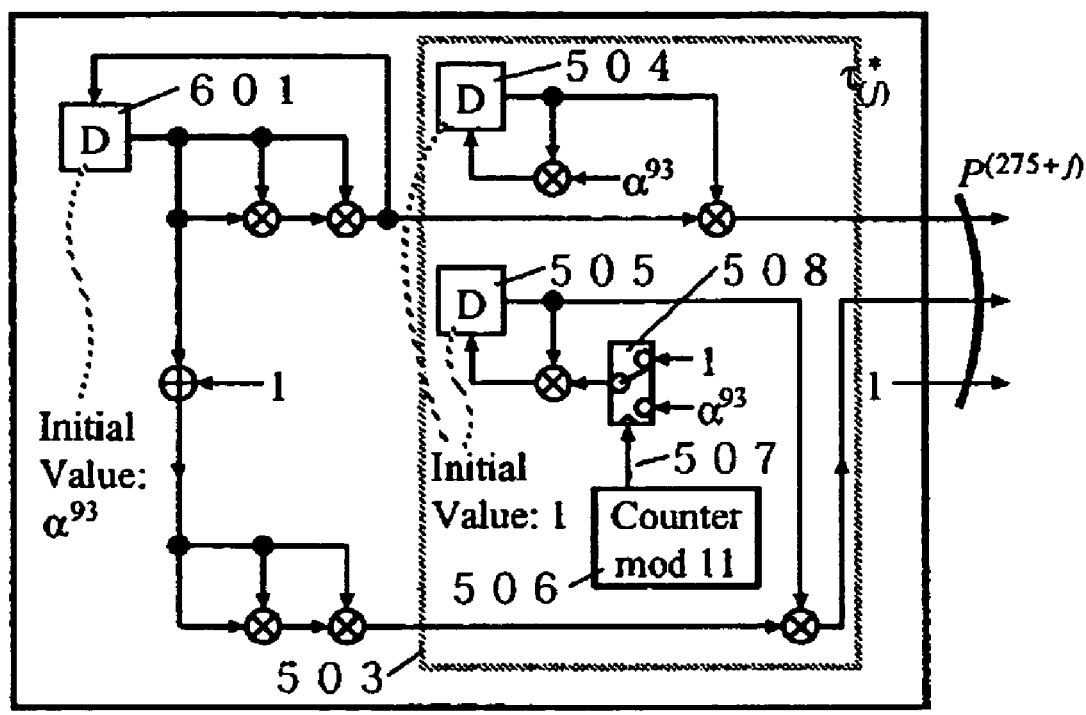
FIG. 6 is a schematic diagram showing a configuration example of a circuit to generate rational points falling in Group C.

FIGS. 4, 5, and 6 are schematic diagrams of the portions of the rational point generator 301 to generate the points belonging to $E(C_{(L)}, GF(2^{2m}))$ which are numbered $P^{(1)}$, $P^{(2)}$, ..., $P^{(3904)}$ in order as defined in equation 11, whereas $\tau^*_{(j)}$ and $\sigma_{(j)}$ are defined in equations 12 and 13, respectively.

$$\begin{cases} P^{(j)} := \sigma_{((j-1) \bmod 3)}((\alpha^{93})^j : 0 : 1) \\ (j = 1, 2, 3, \ldots, 32): \text{Group } A \\ P^{(33+j)} := \tau^*_{(j)} \circ \sigma_{(2 \times (j \bmod 2))}(\alpha^{341} : \alpha^{682} : 1) \\ (j = 0, 1, 2, \ldots, 2 \times 11^2 - 1): \text{Group } B \\ P^{(275+j)} := \tau^*_{(j)}\left(\left(\alpha^{33 \times 3^{j+1}}\right)^3 : \left(\alpha^{33 \times 3^{j+1}} + 1\right)^3 : 1\right) \\ (j = 0, 1, 2, \ldots, 30 \times 11^2 - 1): \text{Group } C \end{cases}$$

Equation 11

$$\tau^*_{(j)} := \tau_{(\lfloor j/11 \rfloor, j \bmod 1, 0)}$$

Equation 12

$$\begin{cases} \sigma_{(0)} := \text{Id. (identity map)} \\ \sigma_{(1)}(\xi_X : \xi_Y : \xi_Z) := (\xi_X : \xi_Z : \xi_Y) \\ \sigma_{(2)}(\xi_X : \xi_Y : \xi_Z) := (\xi_Y : \xi_X : \xi_Y) \end{cases}$$

Equation 13

FIG. 4 is the schematic diagram of a circuit to generate the points $P^{(1)}$, $P^{(2)}$, ..., $P^{(32)}$ in order, labeled "Group A" in the equation 11. Reference numeral 401 denotes a memory to store one coordinate value of $P^{(j)}$ and its initial value is $\alpha^{93}$. When calculating the coordinates of $P^{(j)}$, $(\alpha^{93})^j$ is output from the memory 401 and goes into two branches. One branch further diverges into branches to the inputs of a selector 402. The inputs to the selector 402 are $((\alpha^{93})^j, 0, 1) = \sigma_{(0)}((\alpha^{93})^j, 0, 1)$, $((\alpha^{93})^j, 1, 0) = \sigma_{(1)}((\alpha^{93})^j, 0, 1)$, and $(0, (\alpha^{93})^j, 1) = \sigma_{(2)}((\alpha^{93})^j, 0, 1)$ from the top of the drawing. The selector 402 selects $\sigma_{((j-1) \bmod 3)}((\alpha^{93})^j, 0, 1)$, one of the three inputs, as an output. $(\alpha^{93})^j$ on the other branch is multiplied by $\alpha^{93}$ and stored into the memory 401.

FIG. 5 is the schematic diagram of a circuit to generate the points $P^{(33)}$, $P^{(34)}$, ..., $P^{(274)}$ in order, labeled "Group B" in the equation 11. Reference numerals 501 and 502 denote memories to store $P^{(j)}$ coordinate components before being multiplied by a constant factor of $\tau^*_{(j)}$ and their initial values are $\alpha^{341}$ and $\alpha^{682}$, respectively. When calculating the coordinates of $P^{(j+33)}$, a couple of $(\alpha^{341}, \alpha^{682})$ or a couple of $(\alpha^{682}, \alpha^{341})$ are output from the memories 501 and 502 and go into branches, respectively. The couple of the values on one branch are multiplied by the constant factor of $\tau^*_{(j)}$ and, on the other branch, the output of the memory 501 is stored into the memory 502 and the output of the memory 502 is stored into the memory 501. Reference numerals 504 and 505 are memories to store constants assigned for $\tau^*_{(j)}$ by which the coordinate values are to be multiplied. The output of the memory 504 goes into two branches, the value on one branch and the output of the memory 501 are multiplied, and the value on the other branch is multiplied by $\alpha^{93}$ and stored into the memory 504. The output of the memory 505 goes into two branches, the value on one branch and the output of the memory 502 are multiplied, and the value on the other branch is multiplied by a constant (1 or $\alpha^{93}$) selected by a selector 508 and stored into the memory 505. An undecimal counter 506 is cleared to 0 once every 11 counts. According to a signal 507 output when the undecimal counter 506 is cleared to 0, the selector 508 selects a constant of $\alpha^{93}$ when the counter value is 0; otherwise, it selects a constant of 1.

FIG. 6 is the schematic diagram of a circuit to generate the points $P^{(275)}$, $P^{(276)}$, ..., $P^{(3904)}$ in order, labeled "Group C" in the equation 11. Reference numeral 601 denotes a memory t store one of the coordinate components before being multiplied by a constant factor of $\tau^*_{(j)}$ and its initial value is $\alpha^{93}$. When calculating the coordinates of $P^{(j+275)}$, $(\alpha^{93})^j$ is output from the memory 601 and goes into two branches. The value on one branch is raised to the third power and further goes into branches to be multiplied by the constant factor of $\tau^*_{(j)}$ and to be stored into the memory 601. The value on the other branch, after one is added to it, is raised to the third power and multiplied by the constant factor of $\tau^*_{(j)}$. The same arrangement to assign constants to $\tau^*_{(j)}$ as described for FIG. 5 is provided.

When the numbered points are thus prepared, a matrix M in the matrix arithmetic circuit 306 is a given value, namely, an encoding parameter if the numbered $P^{(1)}$, $P^{(2)}$, ..., $P^{(3904)}$ have been determined. By calculating the matrix M from the equations 2, 4, and 6 by an arithmetic unit or the like beforehand, the encoder can be configured.

Figure 7:
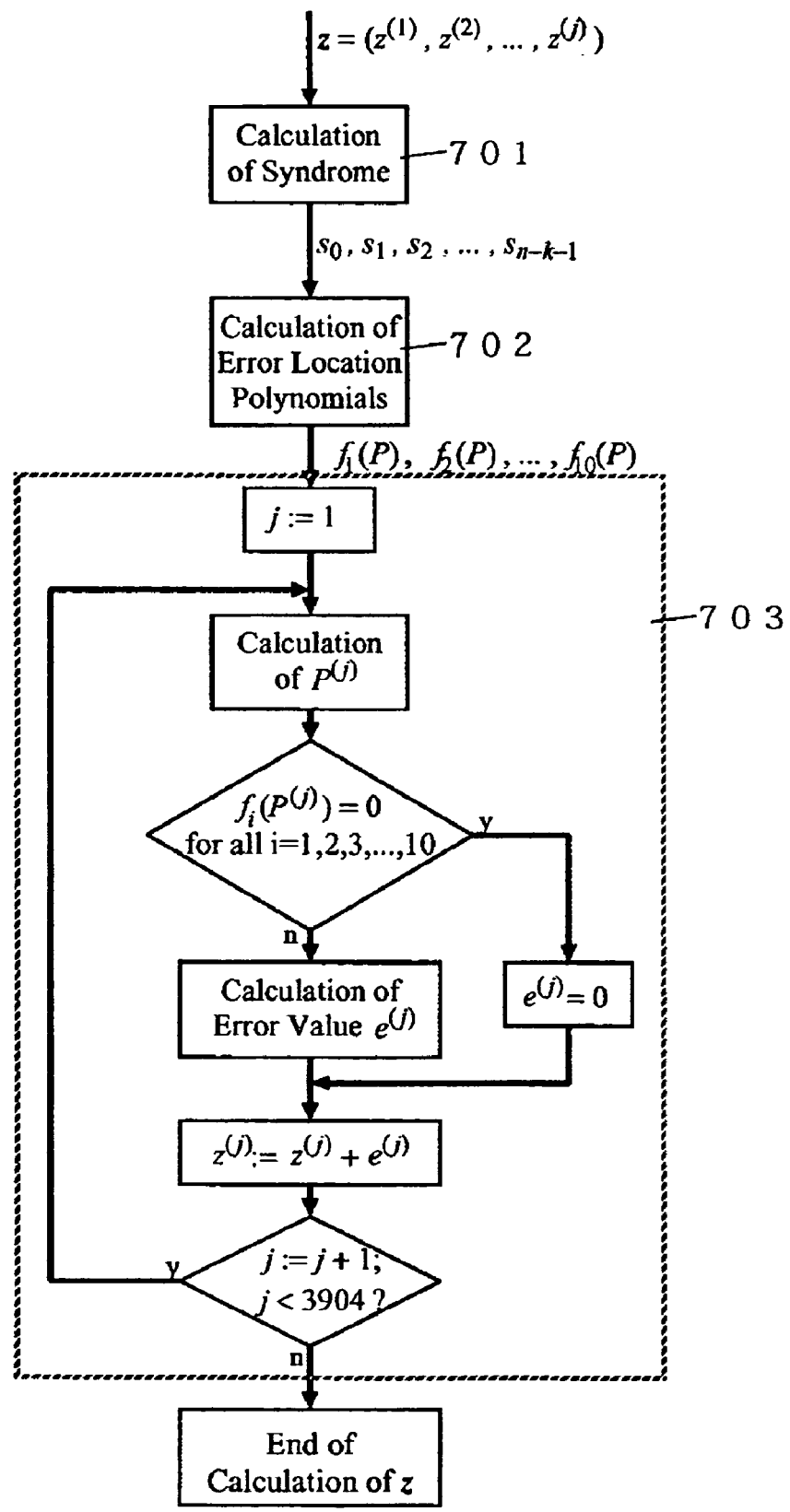
FIG. 7 is a flowchart describing a procedure of error detection and correction by a Fermat decoder circuit.

An example of error detection and correction with the above Fermat code will be described below. FIG. 7 is a flowchart describing a procedure of error detection and correction with the Fermat code. Through a syndrome calculation step 701 for calculating a syndrome that is a set of checksums that become 0 for error-free bit streams from the inputs, an error syndrome $s_0, s_1, s_2, \ldots, s_{n-k-1}$ is calculated. Next, through a polynomial calculation step 702, error location polynomials $f_1(P), f_2(P), \ldots, f_{10}(P)$ are calculated from the error syndrome. Next, an error is located through Chien search and the value of the located error is determined. This procedure corresponds to a process block 703 in FIG. 7.

Figure 8:
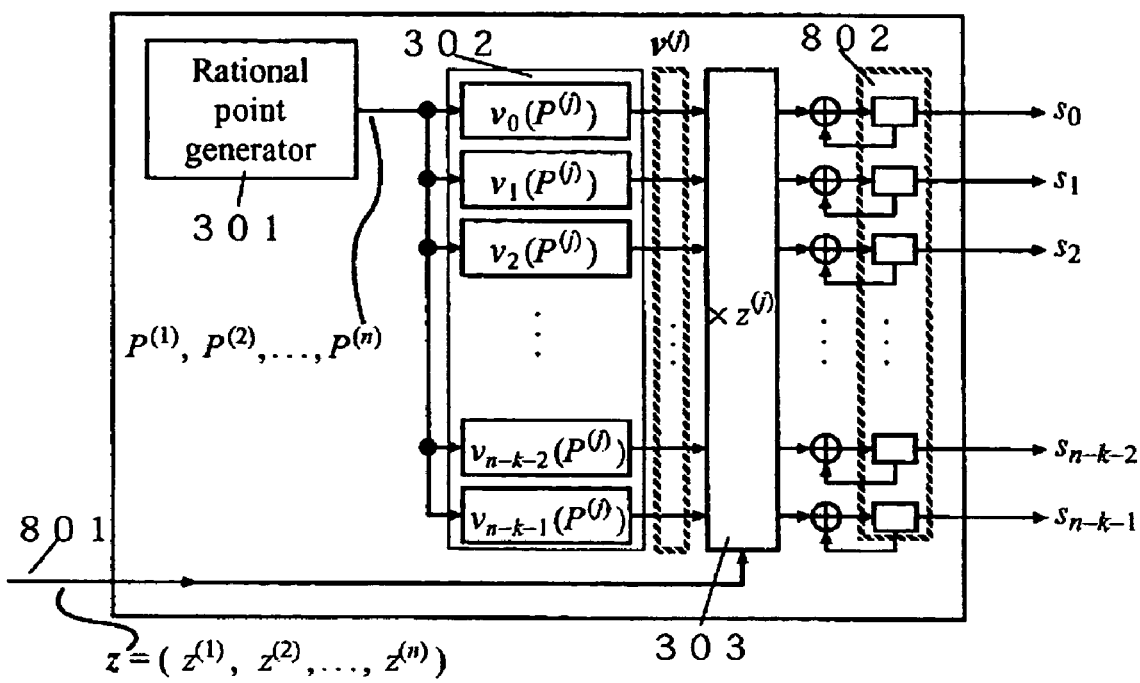
FIG. 8 is a schematic diagram of a syndrome calculation circuit in the Fermat decoder circuit.

FIG. 8 is a schematic diagram of an error syndrome calculation circuit 701. A sequence of input symbols $z^{(1)}$, $z^{(2)}$, ..., $z^{(n)}$ (n=3904 in this example) is input through an input terminal 801. The rational point generator 301 outputs a point $P^{(j)}$ at timing when $z^{(j)}$ is input. When receiving the input of the point $P^{(j)}$, the vector generator circuit 302 outputs a vector $v^{(j)}$. When receiving the inputs of the vector $v^{(j)}$ and the symbol $z^{(j)}$, the scalar multiplier 303 outputs $b^{(j)}v^{(j)}$ which is in turn added to and stored into a memory 802 for storing syndrome data. After completing processing on the n symbols, the result is output as the error syndrome $s_0, s_1, s_2, \ldots, s_{n-k-1}$.

Figure 9:
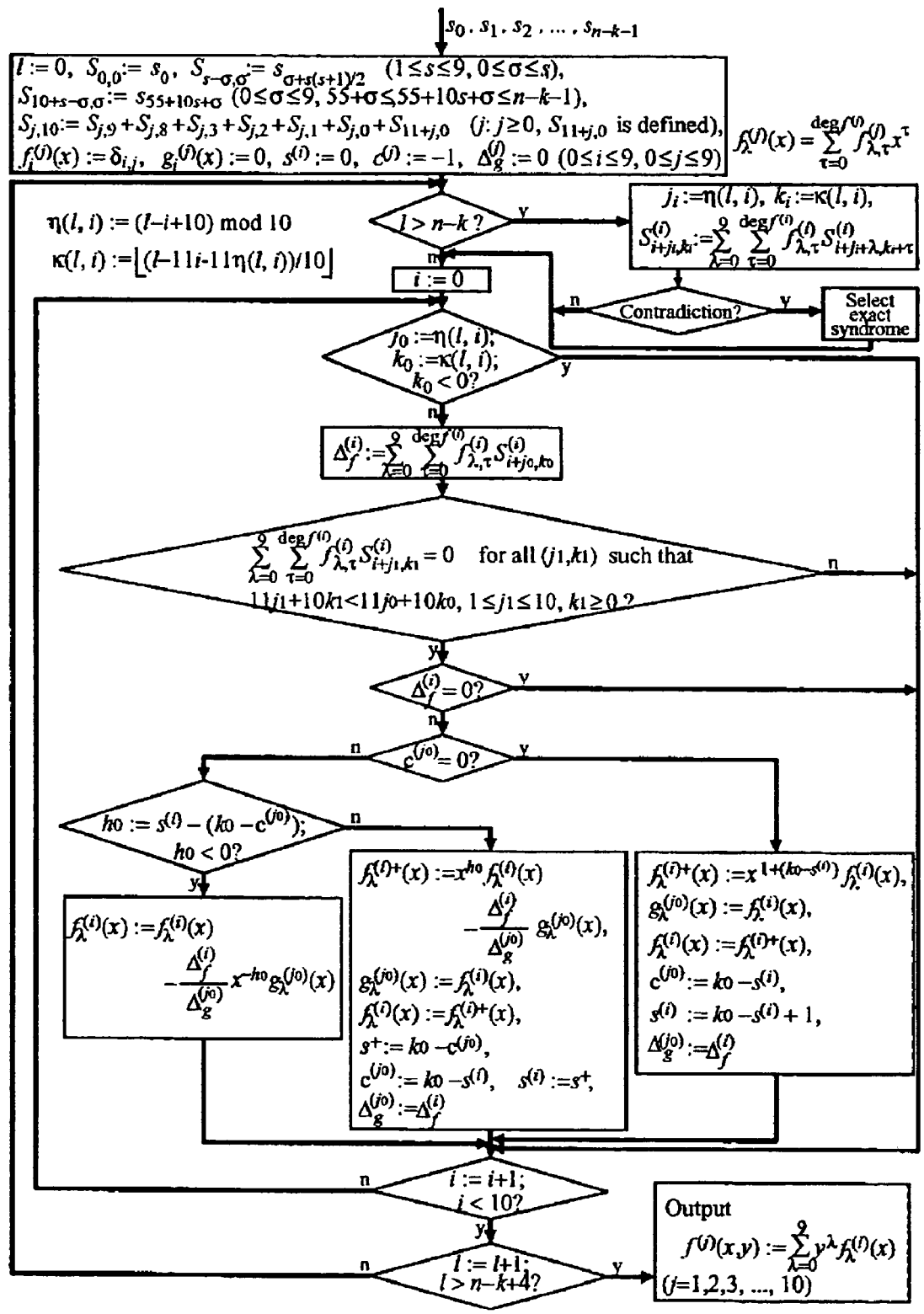
FIG. 9 is a flowchart explaining the details of a polynomial calculation step for locating an error by the Fermat decoder circuit.
Figure 10:
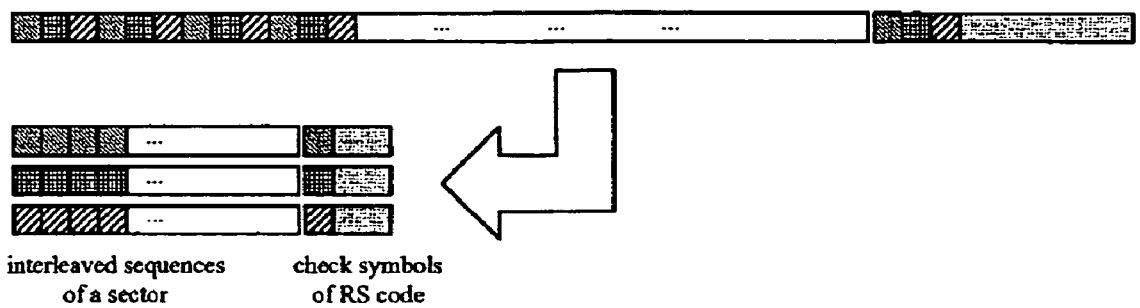
FIG. 10 is a diagram showing the order of symbols including Reed-Solomon parity bytes recorded in a sector and associated RS code structures.
Figure 11:
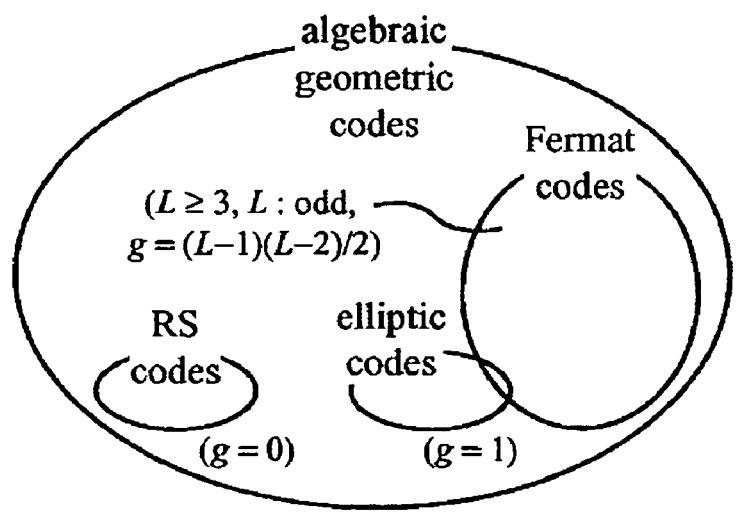
FIG. 11 is a diagram showing relationship among the Reed-Solomon codes, algebraic geometric codes, elliptic codes, and Fermat codes.

FIG. 9 is a flowchart explaining the details of the polynomial calculation step 702 for locating an error. This flowchart is an example of application of an algorithm called Berlekamp-Massey-Sakara (refer to the non-patent documents 3 and 4) to the Fermat code.

Equation 14 represents an example algorithm for calculation of error value $e^{(j)}$. Error value calculation can be executed by using a generalized Forney formula as well (refer to the non-patent document 5).

$$e^{(\lambda)} = \sum_{i=0}^{2^{2m}-2} \sum_{j=0}^{2^{2m}-2} S_{i,j} x(P^{(\lambda)})^{-i} y(P^{(\lambda)})^{-j}, \text{ where}$$

Equation 14

$$S_{i_0, j_0} := \sum_{i=1}^{n} e^{(i)} x(P^{(i)})^{i_0} y(P^{(i)})^{j_0}$$

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims alone with their full scope of equivalents.

What is claimed is:

1. An information recording/reproducing device comprising:
   an interface which converts input signals into binary data;
   an interleaver which separates the converted binary data into one or a plurality of data blocks;
   an encoder circuit which encodes each said data block into an error-correcting code by using an algebraic geometric code (AG code) over a Galois field GF($2^m$) (m is a positive integer), wherein the AG code includes 2t+g redundant symbols (where t is the number of correctable symbols and g is a positive integer) and has a length of up to $2^m+1+g\times2^{1+m/2}$ symbols;
   a signal processing circuit which converts the data blocks encoded in the error-correcting codes into analog signals to be recorded on a recording medium and converts analog signals read from said recording medium into binary data;
   a decoder circuit which detects and corrects errors in the data blocks converted by said signal processing circuit by using said AG code; and
   a deinterleaver which combines the data blocks subjected to error detection and correction.

2. The information recording/reproducing device according to claim 1, wherein said device uses the error-correcting code with a length of up to $2^{10}+1+45\times2^{1+10/2}=3905$ including (2t+45) redundant symbols added in order to correct random errors in up to t symbols (where t≧45), each symbol consisting of 10 bits, for 4-Kbyte data constituting one sector.

3. The information recording/reproducing device according to claim 1, wherein said device uses the AG code over the Galois field GF($2^{2m}$) consisting of a Fermat curve $X^L+Y^L+Z^L=0$ that satisfies g=(L−1)(L−2)/2 (where L is an odd number) over a projective plane $P^2$(GF($2^{2m}$)) (m is a positive integer) or a curve to which the Fermat curve is transformed by birational mapping, satisfying the following two conditions:
   (1) 2m=$2^u$(2e+1), where u≧1 and e≧1; and
   (2) L=($2^m+1$)/($2^\omega+1$), where $\omega=2^{u-1}$.

4. The information recording/reproducing device according to claim 1, wherein said device uses the AG code over the Galois field GF($2^{10}$) that satisfies the following: $\alpha_{n+1-(11h+i)}=\alpha^{-93h}\times\alpha^{-c(i)}$, $\beta_{n+1-(11h+i)}=\alpha^{-93h}\times\alpha^{-c(i)}$, $\gamma_{n+1-(11h+i)}=1$(where 0≦h≦11, 0≦i≦10, 1≦11h+i≦min(n, 3630), c(i)=33×$3^{i+1}$, and α is a primitive root of GF($2^{10}$)), when a point $P^{(j)}=(\alpha_j:\beta_j:\gamma_j)$ on the Fermat curve C: $X^{11}+Y^{11}+Z^{11}=0$ over the projective plane $P^2$(GF($2^{10}$)) (m is a positive integer) is mapped to a j-th (j≧1) symbol position relative to the highest order or lowest order symbol in the code, which is set as the reference position for counting the symbols.

5. An information recording/reproducing device comprising:
   an interface which converts input signals into binary data;
   a Fermat encoder circuit which encodes the binary data as is, as a data block, into an error-correcting code;
   a signal processing circuit which converts the error-correcting code of the data block into analog signals to be recorded on a recording medium and converts analog signals read from said recording medium into binary data;
   a Fermat decoder circuit which detects and corrects errors in the binary data converted by said signal processing circuit.
   wherein the Fermat encoder circuit encodes said data block into an error-correcting code by using an algebraic geometric code (AG code) over a Galois field GF($2^m$) (m is a positive integer), wherein the AG code includes 2t+g redundant symbols (where t is the number of correctable symbols and g is a positive integer) and has a length of up to $2^m+1+g\times2^{1+m/2}$ symbols.

6. The information error recording/reproducing device according to claim 5, wherein Fermat encoder circuit uses the AG code over the Galois field GF($2^{2m}$) consisting of a Fermat curve $X^L+Y^L+Z^L=0$ that satisfies g=(L−1)(L−2)/2 (where L is an odd number) over a projective plane $P^2$(GF($2^2$m)) (m is a positive integer) or a curve to which the Fermat curve is transformed by birational mapping, satisfying the following two conditions:
   (1) 2m=$2^u$(2e+1), where u≧1 and e≧1; and
   (2) L=($2^m+1$)/($2^\omega+1$), where $\omega=2^{u-1}$.

7. The information error recording/reproducing device according to claim 6, wherein said device uses the error-correcting code with a length of up to $2^{10}+1+45\times2^{1+10/2}=3905$ including (2t+45) redundant symbols added in order to correct random errors in up to t symbols (where t≧45), each symbol consisting of 10 bits, for 4-Kbyte data constituting one sector.

8. The information error recording/reproducing device according to claim 5, wherein said Fermat encoder circuit uses the AG code over the Galois field GF($2^{10}$) that satisfies the following: $\alpha_{n+1-(11h+i)}=\alpha^{-93h}\times\alpha^{-c(i)}$, $\beta_{n+1-(11h+i)}=\alpha^{-93h}\times\alpha^{-c(i)}$, $\gamma_{n+1-(11h+i)}=1$ (where 0≦h≦11, 0≦i≦10, 1≦11h+i≦min(n,3630), c(i)=33×$3^{i+1}$, and α is a primitive root of GF($2^{10}$)), when a point $P^{(j)}=(\alpha_j:\beta_j:\gamma_j)$ on the Fermat curve C: $X^{11}+Y^{11}+Z^{11}=0$ over the projective plane $P^2$(GF($2^{10}$)) (m is a positive integer) is mapped to a j-th (j≧1) symbol position relative to the highest order or lowest order symbol in the code, which is set as the reference position for counting the symbols.

9. The information error recording/reproducing device according to claim 5, wherein the Fermat encoder circuit is configured to:
   generate points P corresponding to input symbols received by the Fermat encoder circuit;
   calculate an error syndrome $s_0, s_1, s_2, \ldots, s_{n-k-1}$ through calculating a syndrome that is a set of checksums that become 0 for error-free bit streams from the binary data;
   calculating error location polynomials $f_1(P), f_2(P), \ldots, f_{10}(P)$ from the error syndrome through a polynomial calculation; and
   locating an error through a Chien search, based on the calculated error location polynomials and determining a value of the located error.

10. The information error recording/reproducing device according to claim 9, wherein determining the value of the located error comprises calculating the value using the following equation:

$$e^{(\lambda)} = \sum_{i=0}^{2^{2m}-2} \sum_{j=0}^{2^{2m}-2} S_{i,j} x(P^{(\lambda)})^{-i} y(P^{(\lambda)})^{-j}, \text{ where}$$

$$S_{i_0,j_0} := \sum_{i=1}^{n} e^{(i)} x(P^{(i)})^{i_0} y(P^{(i)})^{j_0}.$$

11. The information error recording/reproducing device according to claim 10, wherein the error location polynomials are calculated using a Berlekamp-Massey-Sakara algorithm.

12. The information error recording/reproducing device according to claim 5, wherein the Fermat encoder circuit comprises:

a rational point generator configured to generate a point $P^{(j)}$ at timing when an input symbol $b^{(j)}$ is inputted;

a vector generator circuit configured to receive the point $P^{(j)}$ from the rational point generator and output a vector $v^{(j)}$;

a scalar multiplier configured to receive the vector $v^{(j)}$ from the vector generator circuit and the input symbol $b^{(j)}$ and output $b^{(j)}v^{(j)}$;

a memory configured to receive the output $b^{(j)}v^{(j)}$ from the scalar multiplier and store syndrome data;

a matrix arithmetic circuit configured to receive the syndrome data from the memory and output vectors MV; and a selector configured to select and output contents of the vectors MV from the matrix arithmetic circuit in order.

13. The information error recording/reproducing device according to claim 12, wherein for points $P^{(j)}=(\alpha_j, \beta_j, 1)$, the vector generator circuit outputs $[v_0(P^{(j)}), v_1(P^{(j)}), v_2(P^{(j)}), \ldots, v_{n-k-1}(P^{(j)})]$ which are obtained, based on (m, L)=(5, 11), by the following equation:

$$\begin{cases} v_0(P^{(j)}) = 1 \\ v_1(P^{(j)}) = \dfrac{\alpha_j}{\beta_j + \gamma_j}, \; v_2(P^{(j)}) = \dfrac{\beta_j}{\beta_j + \gamma_j} \\ v_{\frac{1}{2}s(s+1)+\lambda}(P^{(j)}) = \left(\dfrac{\alpha_j}{\beta_j + \gamma_j}\right)^\lambda \left(\dfrac{\beta_j}{\beta_j + \gamma_j}\right)^{s-\lambda} \quad (2 \leq s \leq 9, 0 \leq \lambda \leq s) \\ v_\lambda(P^{(j)}) = \dfrac{\alpha_j}{\beta_j + \gamma_j} \times v_{j-10}^{(j)}(P^{(j)}) \quad (55 \leq \lambda \leq r-1). \end{cases}$$

14. An information recording/reproducing device comprising:

an interface which converts input signals into binary data;

a Fermat encoder circuit which encodes the binary data as is, as a data block, into an error-correcting code;

a signal processing circuit which converts the error-correcting code of the data block into analog signals to be recorded on a recording medium and converts analog signals read from said recording medium into binary data;

a Fermat decoder circuit which detects and corrects errors in the binary data converted by said signal processing circuit, wherein said Fermat encoder circuit uses the error-correcting code with a length of up to $2^{10}+1+45 \times 2^{1+10/2}=3905$ including (2t+45) redundant symbols added in order to correct random errors in up to t symbols (where t≧45), each symbol consisting of 10 bits, for 4-Kbyte data constituting one sector.

15. The information error recording/reproducing device according to claim 14, wherein the Fermat encoder circuit encodes said data block into an error-correcting code by using an algebraic geometric code (AG code) over a Galois field $GF(2^m)$ (m is a positive integer), wherein the AG code includes 2t+g redundant symbols (where t is the number of correctable symbols and g is a positive integer) and has a length of up to $2^m+1+g \times 2^{1+m/2}$ symbols.

16. The information error recording/reproducing device according to claim 15, wherein the Fermat encoder circuit is configured to:

generate points P corresponding to input symbols received by the Fermat encoder circuit;

calculate an error syndrome $s_0, s_1, s_2, \ldots, s_{n-k-1}$ through calculating a syndrome that is a set of checksums that become 0 for error-free bit streams from the binary data;

calculating error location polynomials $f_1(P), f_2(P), \ldots, f_{10}(P)$ from the error syndrome through a polynomial calculation; and locating an error through a Chien search, based on the calculated error location polynomials and determining a value of the located error.

17. The information error recording/reproducing device according to claim 16, wherein determining the value of the located error comprises calculating the value using the following equation:

$$e^{(\lambda)} = \sum_{i=0}^{2^{2m}-2} \sum_{j=0}^{2^{2m}-2} S_{i,j} x(P^{(\lambda)})^{-i} y(P^{(\lambda)})^{-j}, \text{ where}$$

$$S_{i_0, j_0} := \sum_{i=1}^{n} e^{(i)} x(P^{(i)})^{i_0} y(P^{(i)})^{j_0}.$$

18. The information error recording/reproducing device according to claim 14, wherein the Fermat encoder circuit comprises:

a rational point generator configured to generate a point $P^{(j)}$ at timing when an input symbol $b^{(j)}$ is inputted;

a vector generator circuit configured to receive the point $P^{(j)}$ from the rational point generator and output a vector $v^{(j)}$;

a scalar multiplier configured to receive the vector $v^{(j)}$ from the vector generator circuit and the input symbol $b^{(j)}$ and output $b^{(j)}v^{(j)}$;

a memory configured to receive the output $b^{(j)}v^{(j)}$ from the scalar multiplier and store syndrome data;

a matrix arithmetic circuit configured to receive the syndrome data from the memory and output vectors MV; and a selector configured to select and output contents of the vectors MV from the matrix arithmetic circuit in order.

19. The information error recording/reproducing device according to claim 18, wherein for points $P^{(j)}=(\alpha_j, \beta_j, 1)$, the vector generator circuit outputs $[v_0(P^{(j)}), v_1(P^{(j)}), v_2(P^{(j)}), \ldots, v_{n-k-1}(P^{(j)})]$ which are obtained, based on (m, L)=(5, 11), by the following equation:

$$\begin{cases} v_0(P^{(j)}) = 1 \\ v_1(P^{(j)}) = \dfrac{\alpha_j}{\beta_j + \gamma_j}, \; v_2(P^{(j)}) = \dfrac{\beta_j}{\beta_j + \gamma_j} \\ v_{\frac{1}{2}s(s+1)+\lambda}(P^{(j)}) = \left(\dfrac{\alpha_j}{\beta_j + \gamma_j}\right)^\lambda \left(\dfrac{\beta_j}{\beta_j + \gamma_j}\right)^{s-\lambda} \quad (2 \leq s \leq 9, 0 \leq \lambda \leq s) \\ v_\lambda(P^{(j)}) = \dfrac{\alpha_j}{\beta_j + \gamma_j} \times v_{j-10}^{(j)}(P^{(j)}) \quad (55 \leq \lambda \leq r-1). \end{cases}$$

* * * * *

UNITED STATES PATENT AND TRADEMARK OFFICE
CERTIFICATE OF CORRECTION

PATENT NO.       : 7,526,716 B2                                  Page 1 of 1
APPLICATION NO.  : 11/094019
DATED            : April 28, 2009
INVENTOR(S)      : Kondou et al.

It is certified that error appears in the above-identified patent and that said Letters Patent is hereby corrected as shown below:

Column 4, line 56, please delete "$X^{11}+Y^{11}+Z^{11=b\ 0}$" and insert -- $X^{11}+Y^{11}+Z^{11=}0$ --

Signed and Sealed this

Twenty-third Day of June, 2009

JOHN DOLL
*Acting Director of the United States Patent and Trademark Office*